United States Patent
Matsuo et al.

(10) Patent No.: US 6,812,557 B2
(45) Date of Patent: Nov. 2, 2004

(54) STACKED TYPE SEMICONDUCTOR DEVICE

(75) Inventors: Mie Matsuo, Kamakura (JP); Takashi Yoda, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/673,192

(22) Filed: Sep. 30, 2003

(65) Prior Publication Data

US 2004/0129939 A1 Jul. 8, 2004

(30) Foreign Application Priority Data

Sep. 30, 2002 (JP) ........................................ 2002-286515

(51) Int. Cl.⁷ .............................................. H01L 23/02
(52) U.S. Cl. ...................................... 257/686; 257/777
(58) Field of Search ................................ 257/686, 685, 257/777, 723, 724

(56) References Cited

U.S. PATENT DOCUMENTS

| | | | | | |
|---|---|---|---|---|---|
| 4,021,838 | A | * | 5/1977 | Warwick | 257/777 |
| 4,721,995 | A | * | 1/1988 | Tanizawa | 257/777 |
| 4,954,875 | A | * | 9/1990 | Clements | 257/686 |
| 5,426,072 | A | * | 6/1995 | Finnila | 438/107 |
| 5,936,302 | A | * | 8/1999 | Pedersen et al. | 257/665 |
| 6,353,264 | B1 | * | 3/2002 | Coronel et al. | 257/777 |
| 6,486,528 | B1 | * | 11/2002 | Pedersen et al. | 257/529 |
| 6,614,106 | B2 | | 9/2003 | Matsuo et al. | |
| 6,624,506 | B2 | | 9/2003 | Sasaki et al. | |
| 6,670,701 | B2 | * | 12/2003 | Matsuura et al. | 257/686 |
| 6,737,738 | B2 | * | 5/2004 | Koh et al. | 257/686 |

FOREIGN PATENT DOCUMENTS

| | | |
|---|---|---|
| JP | 05-283606 | 10/1993 |
| JP | 2760188 | 3/1998 |
| JP | 2000-349229 | 12/2000 |
| JP | 2001-102479 | 4/2001 |
| JP | 2002-110865 | 4/2002 |

* cited by examiner

Primary Examiner—S. V. Clark
(74) Attorney, Agent, or Firm—Finnegan, Henderson, Farabow, Garrett & Dunner, L.L.P.

(57) ABSTRACT

Disclosed is a stacked type semiconductor device comprising a predetermined semiconductor integrated circuit chip and at least one semiconductor integrated circuit chip which are stacked, the at least one semiconductor integrated circuit chip including a group of circuit blocks, and the predetermined semiconductor integrated circuit chip comprising a storage section configured to store defect information indicative of a defective circuit block if the group includes the defective circuit block and a replacement circuit section configured to replace the defective circuit block.

20 Claims, 5 Drawing Sheets

STACKED TYPE SEMICONDUCTOR DEVICE

CROSS-REFERENCE TO RELATED APPLICATIONS

This application is based upon and claims the benefit of priority from the prior Japanese Patent Application No. 2002-286515, filed Sep. 30, 2002, the entire contents of which are incorporated herein by reference.

BACKGROUND OF THE INVENTION

1. Field of the Invention

The present invention relates to a stacked type semiconductor device having a plurality of stacked semiconductor integrated circuit chips.

2. Description of the Related Art

In response to demands for a reduction in the size of electronic equipment, a stacked type semiconductor device (multichip device) has been proposed which has a plurality of stacked semiconductor integrated circuit chips (LSI chips).

It is contemplated that if a stacked type semiconductor device is manufactured, chips may be individually subjected to operation tests so that only normal chips can be sorted out and stacked. However, testing the individual chips increases the time and effort required for the tests. This may create problems such as an increase in costs and a delay in delivery.

To solve these problems, it is contemplated that instead of being individually tested, the chips may be stacked before the whole module is tested. However, if any one of the stacked chips is defective, the whole module becomes defective. Consequently, yield may decrease, which increases the costs. Further, every chip may be provided with a redundancy circuit. However, since each chip is provided with the extra circuit, the costs also increase.

Therefore, it has hitherto been difficult to obtain a stacked type semiconductor device which enables stacked chips to be tested and which can prevent a decrease of yield and an increase of extra circuit.

As a prior art technique, Japanese Patent No. 2760188 discloses a technique by which one chip has a plurality of functional blocks so that a defective block can be replaced with another chip. Specifically, chips are produced beforehand each of which has a mirror symmetrical relationship with a corresponding functional block. Then, on a defective functional block, the corresponding mirror symmetrical chip is stacked. However, the mirror symmetrical chips must be tested before being stacked. This may increase the required time and effort. Further, the mirror symmetrical chip must be produced for every functional block. This may also increase the required time and effort.

Jpn. Pat. Appln. KOKAI Publication No. 2000-349229 discloses a technique of constructing a stacked type DRAM by combining defective chips (partial chips) for which part of an address space does not function correctly. However, this technique requires the chips to be tested before stacking in order to check whether or not they are defective. This may increase the required time and effort.

Jpn. Pat. Appln. KOKAI Publication No. 5-283606 discloses a semiconductor device having a plurality of stacked DRAM chips each of which is provided with a redundancy circuit. However, since every chip is provided with the redundancy circuit, this technique is very wasteful. As a result, the costs may increase.

In this manner, although the stacked type semiconductor devices have been proposed each of which has a plurality of stacked semiconductor integrated circuit chips, it has hitherto been difficult to obtain a stacked type semiconductor device which enables stacked chips to be tested and which can prevent a decrease of yield and an increase of extra circuit.

BRIEF SUMMARY OF THE INVENTION

According to an aspect of the present invention, there is provided a stacked type semiconductor device comprising a predetermined semiconductor integrated circuit chip and at least one semiconductor integrated circuit chip which are stacked, the at least one semiconductor integrated circuit chip including a group of circuit blocks, and the predetermined semiconductor integrated circuit chip comprising a storage section configured to store defect information indicative of a defective circuit block if the group includes the defective circuit block and a replacement circuit section configured to replace the defective circuit block.

DETAILED DESCRIPTION OF THE INVENTION

An embodiment of the present invention will be described with reference to the drawings.

Figure 1:
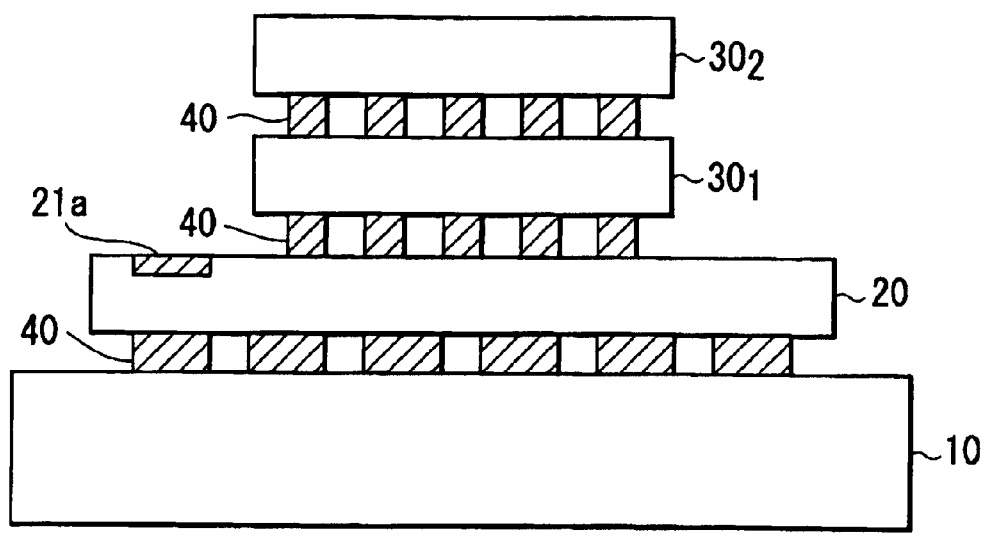
FIG. 1 is a diagram schematically showing an example of a configuration of a stacked type semiconductor device according to an embodiment of the present invention.

FIG. 1 is a diagram schematically showing an example of a configuration of a stacked type semiconductor device according to an embodiment of the present invention.

The device has semiconductor integrated circuit chips 20, 30₁, and 30₂ stacked on a base substrate (package substrate, foe example) 10. Bumps (conductive connection member) 40 are provided between them. The semiconductor integrated circuit chips 20, 30₁, and 30₂ are each provided with a plurality of through plugs (not shown) that penetrate the semiconductor substrate. Circuits on the chips are electrically connected together via these through plugs and bumps 40. In the description below, for convenience, the chip 20 may be referred to as a "particular chip (predetermined chip)". The chips $30_1$ and $30_2$ may be referred to non-particular chips. Further, the number of non-particular chips is one or more, preferably two or more.

The semiconductor integrated circuit chips 20, $30_1$, and $30_2$ will be described below in brief with reference to FIGS. 2, 3, and 4.

Figure 3A:
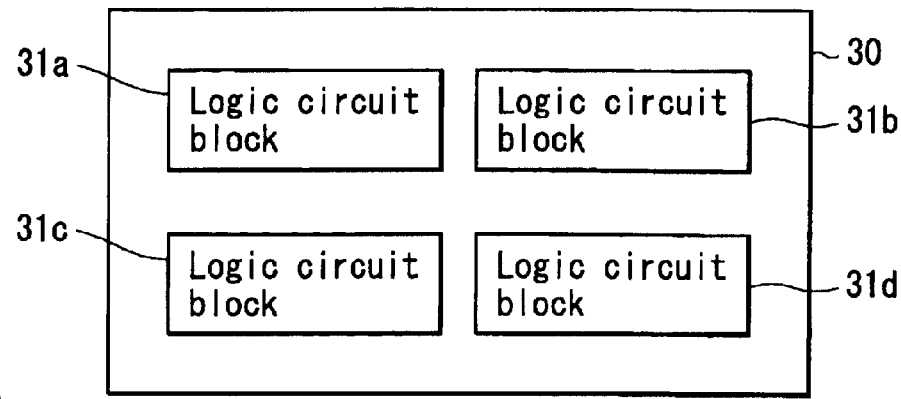
FIGS. 3A to 3C are diagrams each showing an example of an internal configuration of a semiconductor integrated circuit chip (non-particular chip) according to the embodiment of the present invention.
Figure 3B:
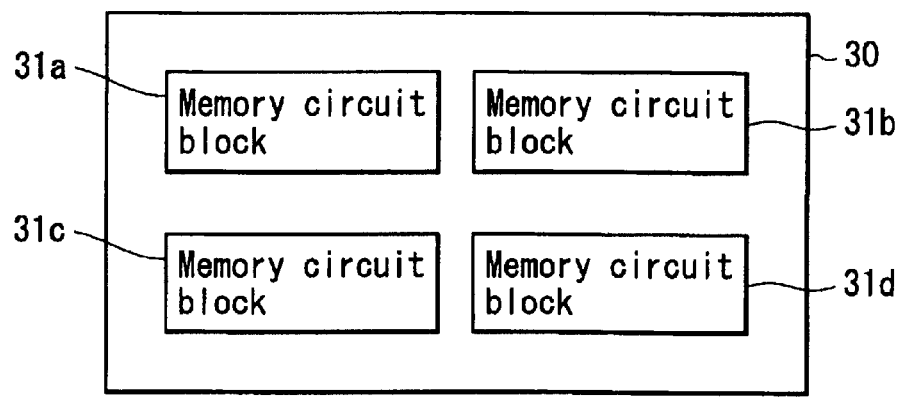
Figure 3C:
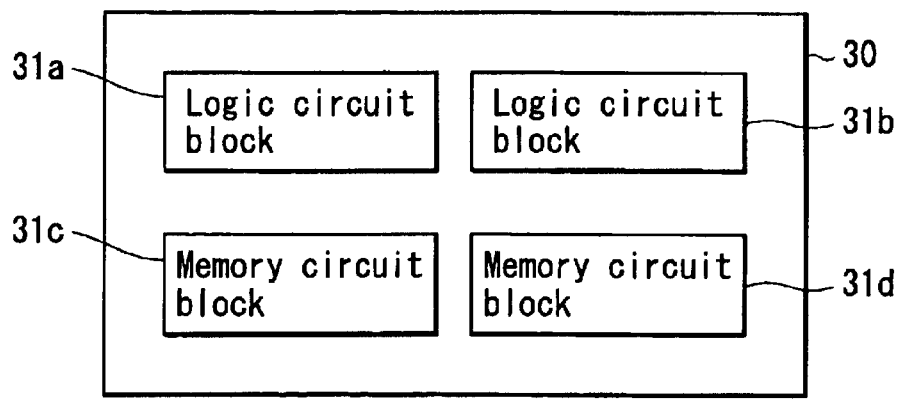

FIGS. 3A to 3C are diagrams showing examples of a semiconductor integrated circuit chip (non-particular chip) 30 (corresponding to the semiconductor integrated circuit chip $30_1$ or $30_2$).

As shown in the figures, the chip 30 includes circuit blocks 31a to 31d. FIG. 3A shows an example of a chip (logic-based chip) in which each of the circuit blocks 31a to 31d is composed of a logic circuit block. FIG. 3B shows an example of a chip (memory-based chip) in which each of the circuit blocks 31a to 31d is composed of a memory circuit block. FIG. 3C shows an example of a chip (mixed chip) in which the circuit blocks 31a and 31b are each composed of a logic circuit block and in which the circuit blocks 31c and 31d are each composed of a memory circuit block. The logic circuit block is configured to perform a predetermined operation using a combination of logic circuits. The memory circuit block has a structure in which memory cells selected on the basis of address information are arranged.

In the non-particular chip 30 shown in FIGS. 3A to 3C, an arbitrary combination of chips can be stacked. That is, only the same type of chips such as only logic- or memory-based chips or mixed chips may be stacked or different types of chips may be stacked.

If one or more non-particular chips 30 contain both logic circuit blocks and memory circuit blocks, there are a group of logic circuit blocks and a group of memory circuit blocks. The circuit blocks included in the group of logic circuit blocks normally have different circuit configurations and perform different circuit operations. The circuit blocks included in the group of memory circuit blocks may have different circuit configurations but normally have equivalent circuit configurations (substantially the same configuration). If different types of memory circuit blocks such as DRAM blocks and EEPROM blocks are included, then for example, the circuit blocks have equivalent circuit configurations within the group of DRAM blocks or EEPROM blocks.

Figure 2:
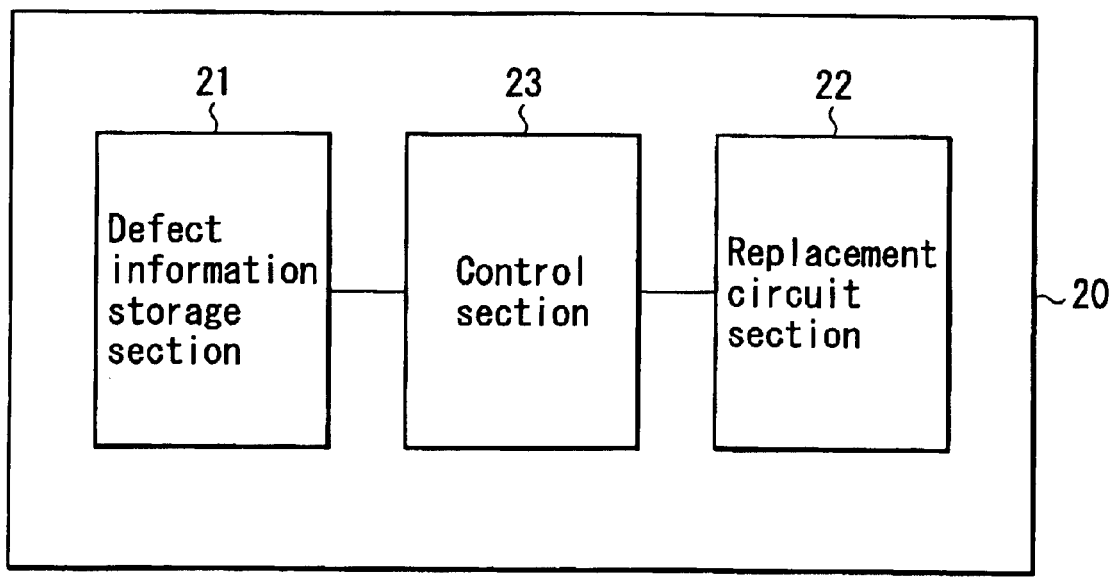
FIG. 2 is a block diagram showing an example of an internal configuration of a semiconductor integrated circuit chip (particular chip) according to the embodiment of the present invention.

FIG. 2 is a block diagram showing an example of an internal configuration of the semiconductor integrated circuit chip (particular chip) 20.

The semiconductor integrated circuit chip 20 contains a defect information storage section 21, a replacement circuit section 22, and a control section 23 that executes control of the replacement circuit section 22 and the like.

The defect information storage section 21 stores defect information indicative of a defective circuit block that may be contained in the chip $30_1$ or $30_2$. For example, the defect information storage section 21 stores address information on the defective circuit block. On the other hand, if there are no defective circuit blocks, this may be stored in the defect information storage section 21.

The defect information storage section 21 may be formed of, for example, a nonvolatile storage element. The nonvolatile storage element may be of an electrically writable type, but in the present embodiment, is a fuse blown out by external laser beams. A fuse section is arranged at a position that can be irradiated with laser beams. In the present example, as shown in FIG. 1, the fuse section 21a is arranged in the area in which the chip 20 does not overlap the chip $30_1$ or $30_2$. The fuse section 21a has only to be arranged at the position that can be irradiated with laser beams. For example, if the particular chip 20 is arranged at the top, the fuse section 21a can be arranged at a desired position on the surface of the particular chip 20.

The replacement circuit section 22 is used to replace a defective circuit block that may be contained in the chip $30_1$ or $30_2$. The replacement circuit section 22 for replacing a logic circuit block may be formed of an externally programmable circuit, for example, an FPGA (Field Programmable Gate Array). If the chip $30_1$ or $30_2$ contains a defective logic circuit block, a circuit equivalent to this defective logic circuit block is set (programmed) in the replacement circuit section 22. If the chip $30_1$ or $30_2$ does not contain any defective logic circuit blocks, the replacement circuit section 22 is kept unprogrammed. In the replacement circuit section 22 for replacing a memory circuit block, a circuit equivalent to the memory circuit block is formed before chip stacking.

Figure 4:
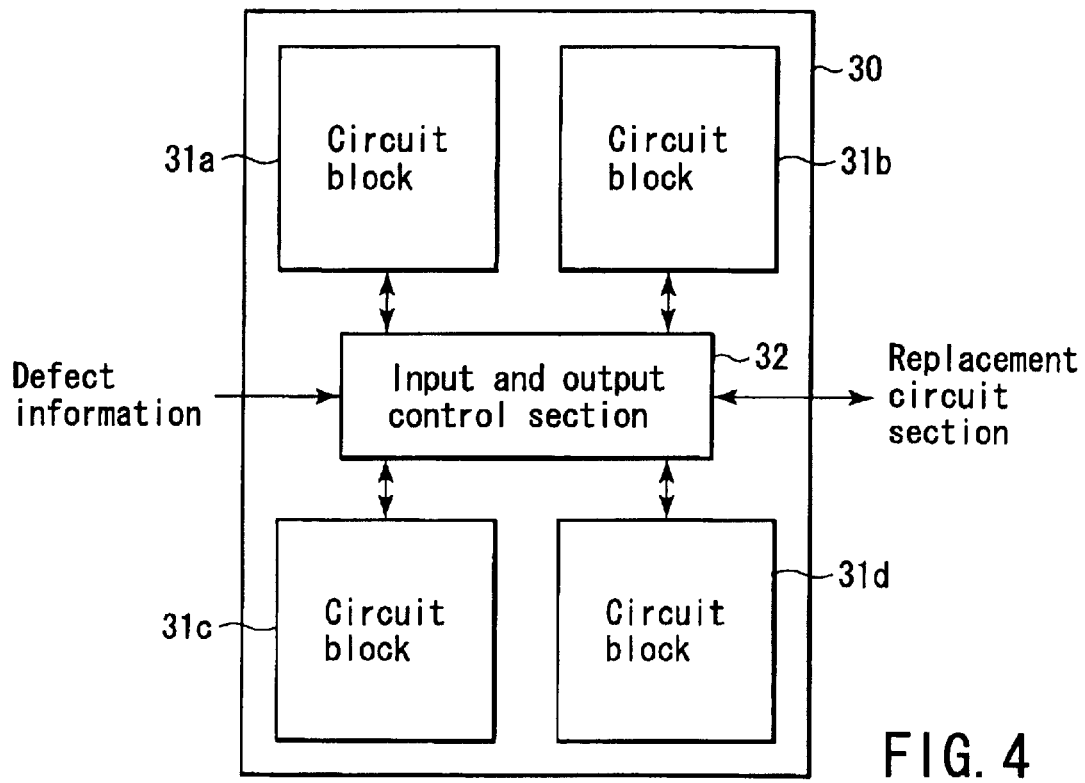
FIG. 4 is a block diagram showing an example of an internal configuration of a semiconductor integrated circuit chip (non-particular chip) according to the embodiment of the present invention.

FIG. 4 is a block diagram showing an example of an internal configuration of the semiconductor integrated circuit chip (non-particular chip) 30.

The circuit blocks 31a to 31d are connected to the input and output control section 32. The input and output control section 32 receives defect information from the defect information storage section 21 in the chip 20 to control the input and output relationship between the circuit blocks 31a to 31d and the replacement circuit section 22 in the chip 20. Specifically, if the circuit blocks 31a to 31d include a defective circuit block, a signal to be inputted to the defective circuit block is transmitted to the replacement circuit section 22 via the input and output control section 32. Further, a signal transmitted from the replacement circuit section 22 via the input and output control section 32 is used as an output signal in place of a signal to be outputted by the defective circuit block.

Figure 5:
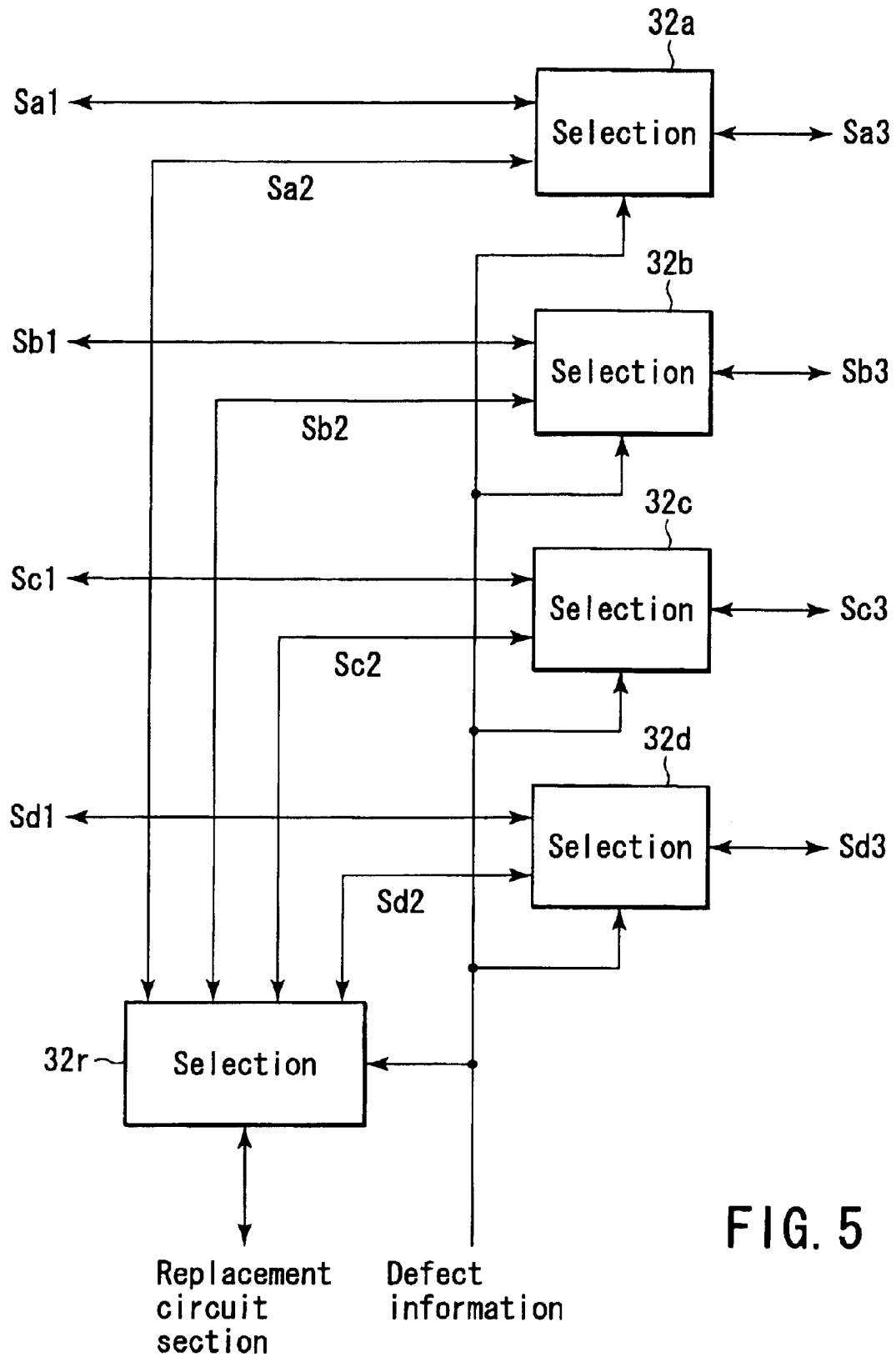
FIG. 5 is a block diagram showing a specific example of the input and output control section shown in FIG. 4.

FIG. 5 is a block diagram showing a specific example of the input and output circuit section 32, shown in FIG. 4.

As shown in FIG. 5, the input and output control section 32 comprises a selecting section 32a provided between the circuit block 31a and a circuit outside the circuit block 31a, a selecting section 32b provided between the circuit block 31b and a circuit outside the circuit block 31b, a selecting section 32c provided between the circuit block 31c and a circuit outside the circuit block 31c, a selecting section 32d provided between the circuit block 31d and a circuit outside the circuit block 31d, and a selecting section 32r provided between the selecting section 32a to 32d and the replacement circuit section 22 in the chip 20. Defect information from the defect information storage section 21 in the chip 20 is inputted to the selecting sections 32a, 32b, 32c, 32d, and 32r as a selection signal.

In the description below, for example, the circuit block 31a is assumed to be defective. In this case, the selecting section 32a receives defect information from the defect information storage section 21 to bring an input or output signal $S_{a1}$ for the circuit block 31a into a non-selected state, while bringing an input or output signal $S_{a2}$ for the replacement circuit section 22 into a selected state. As a result, a signal $S_{a3}$ to be inputted to the circuit block 31a is transmitted to the replacement circuit section 22 via the selecting section 32r as the signal $S_{a2}$. Further, the signal $S_{a2}$ transmitted from the replacement circuit section 22 via the selecting section 32r in place of a signal originally to be outputted by the circuit block 31a is supplied to the circuit outside the circuit block 31a as the signal $S_{a3}$. Signals $S_{b1}$, $S_{c1}$, and $S_{d1}$ are selected for the normal (non-defective) circuit blocks other than the circuit block 31a, i.e. the circuit blocks 31b, 31c, and 31d. If none of the circuit blocks 31a to 31d are defective, the selecting sections 32a to 32d select the signals $S_{a1}$ to $S_{d1}$, and no signals are transmitted to or from the replacement circuit section 22.

The configuration of the input and output control section shown in FIG. 5 is applicable to the input section, output section, and input and output section (such as an I/O terminal of a memory block, which is used both as an input and as an output) of either the logic circuit block or the memory circuit block.

Figure 6:
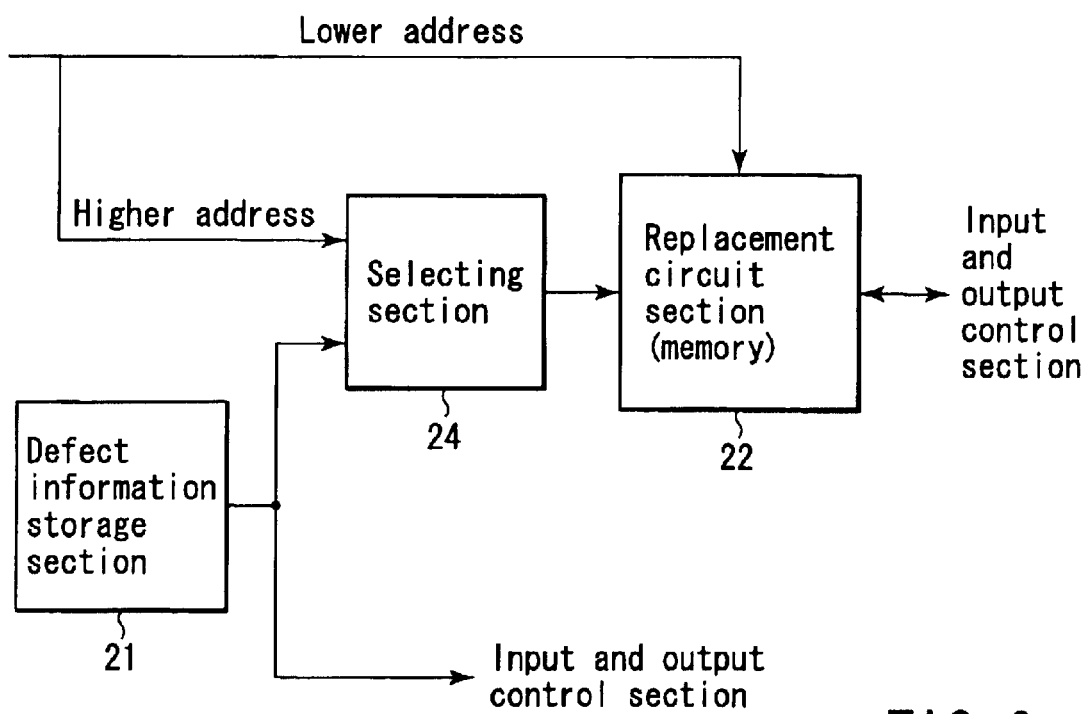
FIG. 6 is a block diagram showing an example of an internal configuration of a semiconductor integrated circuit chip (particular chip) according to the embodiment of the present invention.

For the input of an address signal to the memory circuit block and to the replacement circuit for the memory circuit block, it is possible to employ a configuration different from that shown in FIG. 5. FIG. 6 is a block diagram showing an example of an internal configuration of the chip 20 in the case in which the different configuration is employed.

In the present example of a configuration, higher bits (in the present example, 2 bits) of an address signal are used as a block selection signal for the circuit blocks (memory circuit blocks) 31a to 31d. The address signal is inputted to the non-particular chip so that its higher bits and lower bits can be used to select a memory circuit block and a memory cell contained in the memory circuit block. The address signal is also inputted to the particular chip 20. The defect information storage section 21 of the chip 20 stores, as defect information, address information (in the present example, 2-bit information) indicative of a defective circuit block.

When an external address signal is supplied, the higher bits (2 bits) of the address signal are transmitted to a selecting section 24 included in the control section 23, shown in FIG. 2. If the higher bits of the address signal match the address of a defective circuit block stored in the defect information storage section 21, i.e. access information has been transmitted which is required to access the defective circuit block, then the selecting section 24 selects the replacement circuit section 22. The lower bits of the address signal are inputted to the replacement circuit section 22. Consequently, in the replacement circuit section 22, the memory cell corresponding to the designated address is selected. Data is then written in or read from the selected memory cell. Input and output sections of the replacement circuit section 22 is connected to the input and output control section 32, shown in FIG. 4. Accordingly, operations of transmitting and receiving data are performed via the input and output control section 32.

In this manner, in the above example, the address signal the higher bits of which are used to select a memory circuit block is supplied not only to the non-particular chip but also to the particular chip. The use of such an arrangement eliminates the need to use a circuit such as the one shown in FIG. 5, for the input of the address signal. If, in addition to the address signal, a block selection signal is inputted which selects a memory circuit block, it is also possible to employ a configuration free from a configuration such as the one shown in FIG. 5, for the input of the address signal and block selection signal.

Figure 7:
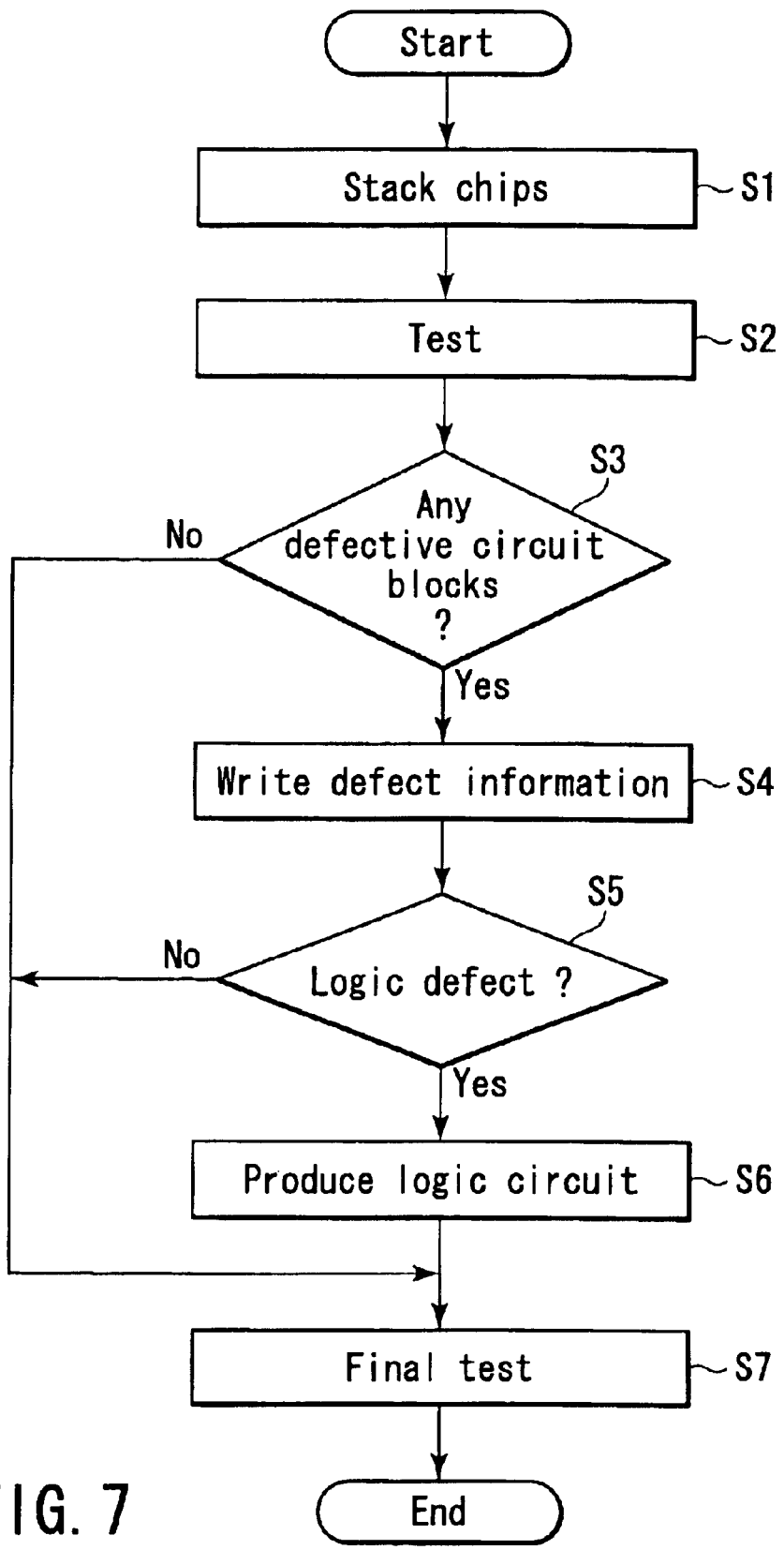
FIG. 7 is a flow chart showing a manufacturing method for a stacked type semiconductor device according to the embodiment of the present invention.

Now, with the flow chart shown in FIG. 7, description will be given of a manufacturing method for a stacked type semiconductor device according to the present embodiment. In the description below, it is assumed that the stacked type semiconductor device includes both logic circuit blocks and memory circuit blocks.

First, semiconductor integrated circuit chips are stacked on a base substrate (S1). Subsequently, with the chips stacked, the whole module is tested (S2). Then, it is determined on the basis of the results of the test whether or not there are any defects (S3). If there are no defects, the process shifts to a final test, described later. If there is a defect, defect information is written in the defect information storage section 21 (S4). Then, it is determined whether or not the defect is occurring in a logic circuit block (S5). If the defect is not occurring in any logic circuit blocks, i.e. if the defect is occurring in a memory circuit block, then the process shifts to the final test, described later. If the defect is occurring in a logic circuit block, a circuit equivalent to the defective logic circuit block is set in the replacement circuit section 22. For example, if an FPGA is used as the replacement circuit section 22, the circuit equivalent to the defective logic circuit block is programmed in the FPGA (S6). Subsequently, the final test is carried out to determine whether or not the whole module is acceptable (S7).

As described above, according to the present embodiment, the predetermined chip (particular chip) is provided with the storage section that stores defect information used to identify a defective circuit block in another chip (non-particular chip) and the replacement circuit section used to replace the defective circuit block. Thus, if the chips are stacked and then the whole module is tested to detect a defective circuit block, the replacement circuit section can be used to recover the defective circuit block. This makes it possible to reduce the time and effort required for the tests, while increasing the yield of the whole module. Further, the replacement circuit section, provided in the predetermined chip, can be shared by the plurality of circuit blocks. It is thus possible to minimize the amount of circuits for replacement. Therefore, an excellent stacked type semiconductor device is obtained which can prevent a delay in delivery and an increase in costs.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A stacked type semiconductor device comprising a predetermined semiconductor integrated circuit chip and at least one semiconductor integrated circuit chip which are stacked, said at least one semiconductor integrated circuit chip including a group of circuit blocks, and the predetermined semiconductor integrated circuit chip comprising a storage section configured to store defect information indicative of a defective circuit block if the group includes the defective circuit block and a replacement circuit section configured to replace the defective circuit block.

2. The stacked type semiconductor device according to claim 1, wherein the circuit blocks included in the group are logic circuit blocks.

3. The stacked type semiconductor device according to claim 2, wherein the replacement circuit section has a circuit equivalent to the defective circuit block.

4. The stacked type semiconductor device according to claim 3, wherein the circuit equivalent to the defective circuit block is produced after the predetermined semiconductor integrated circuit chip and said at least one semiconductor integrated circuit chip have been stacked.

5. The stacked type semiconductor device according to claim 2, wherein the replacement circuit section has a configuration capable of producing a circuit equivalent to each of the circuit blocks included in the group.

6. The stacked type semiconductor device according to claim 1, wherein the circuit blocks included in the group are memory circuit blocks.

7. The stacked type semiconductor device according to claim 6, wherein each of the circuit blocks included in the group has an equivalent circuit.

8. The stacked type semiconductor device according to claim 7, wherein the replacement circuit section has a circuit equivalent to each of the circuit blocks included in the group.

9. The stacked type semiconductor device according to claim 6, wherein the predetermined semiconductor integrated circuit chip further comprises a selecting section configured to select the replacement circuit section by receiving access information used to access the defective circuit block.

10. The stacked type semiconductor device according to claim 9, wherein the selecting section selects the replacement circuit section in accordance with higher bit of an address signal for said at least one semiconductor integrated circuit chip and the defect information stored in the storage section.

11. The stacked type semiconductor device according to claim 10, wherein lower bits of the address signal are used to select a memory cell in the memory circuit block.

12. The stacked type semiconductor device according to claim 11, wherein the lower bits of the address signal are inputted to the replacement circuit section of the predetermined semiconductor integrated circuit chip.

13. The stacked type semiconductor device according to claim 1, wherein said least one semiconductor integrated circuit chip includes an input and output control section configured to control an input and output relationship between the circuit blocks included in the group and the replacement circuit section by receiving the defect information.

14. The stacked type semiconductor device according to claim 1, wherein said at least one semiconductor integrated circuit chip includes a selecting section configured to select the replacement circuit section by receiving the defect information.

15. The stacked type semiconductor device according to claim 1, wherein the storage section stores the defect information after the predetermined semiconductor integrated circuit chip and said at least one semiconductor integrated circuit chip have been stacked.

16. The stacked type semiconductor device according to claim 1, wherein the storage section stores information indicating that the group does not include any defective circuit blocks if the group does not include any defective circuit blocks.

17. The stacked type semiconductor device according to claim 1, wherein the storage section includes a fuse portion arranged at a predetermined position which can be externally irradiated with an energy beam.

18. The stacked type semiconductor device according to claim 17, wherein the predetermined position is within an area in which the predetermined semiconductor integrated circuit chip does not overlap said at least one semiconductor integrated circuit chip.

19. The stacked type semiconductor device according to claim 1, wherein said at least one semiconductor integrated circuit chip includes at least two semiconductor integrated circuit chips.

20. The stacked type semiconductor device according to claim 19, wherein each of said at least two semiconductor integrated circuit chips is capable of using the replacement circuit section.

* * * * *